US008930396B2

(12) United States Patent
Tsao et al.

(10) Patent No.: US 8,930,396 B2
(45) Date of Patent: Jan. 6, 2015

(54) METHOD AND SYSTEM FOR DETECTING AN APPLICANCE BASED ON USERS' FEEDBACK INFORMATION

(75) Inventors: Shiao-Li Tsao, Hsinchu (TW); Yi-Sheng Lai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 91 days.

(21) Appl. No.: 13/560,490

(22) Filed: Jul. 27, 2012

(65) Prior Publication Data

US 2013/0132423 A1   May 23, 2013

(30) Foreign Application Priority Data

Nov. 21, 2011   (TW) .............................. 100142497 A (51) Int. Cl.

| G06F 7/00 | (2006.01) |
|---|---|
| G06F 17/30 | (2006.01) |
| G06Q 10/06 | (2012.01) |
| G01R 21/133 | (2006.01) |
| G06F 17/18 | (2006.01) |

(52) U.S. Cl.
CPC .............. G06Q 10/06 (2013.01); G01R 21/133 (2013.01); G06F 17/18 (2013.01)
USPC ............... 707/769; 702/61; 702/62; 713/300; 713/320; 713/340

(58) Field of Classification Search
CPC ....... Y04S 20/38; Y04S 20/242; Y04S 20/46; Y04S 20/221; Y04S 20/327; Y04S 20/42; Y04S 20/44; Y04S 40/121; Y04S 40/126; H02J 3/14; H02J 2003/143; H02J 13/002; Y02B 90/244; Y02B 90/246

USPC .......................................................... 707/769
See application file for complete search history.

(56) References Cited

U.S. PATENT DOCUMENTS

| 2009/0312968 | A1* | 12/2009 | Phillips ........................... 702/62 |
|---|---|---|---|
| 2010/0167659 | A1* | 7/2010 | Wagner ....................... 455/67.11 |
| 2010/0280978 | A1* | 11/2010 | Shimada et al. ................ 706/12 |
| 2011/0112780 | A1* | 5/2011 | Moss .............................. 702/62 |
| 2011/0145611 | A1* | 6/2011 | Lee ................................ 713/320 |
| 2011/0185196 | A1* | 7/2011 | Asano et al. .................. 713/300 |

(Continued)

OTHER PUBLICATIONS

Yi-Sheng Lai, "A Novel Search Scheme for Nonintrusive Load Monitoring Systems", Industrial Technology (ICIT), 2012 IEEE International Conference, Athens, Mar. 19-21, 2012, pp. 1-6.

*Primary Examiner* — Binh V Ho
(74) *Attorney, Agent, or Firm* — Muncy, Geissler, Olds & Lowe, P.C.

(57) ABSTRACT

A method and system for detecting an appliance based on users' feedback information, particularly a nonintrusive load monitoring method and system based on a user's feedback information and a joint strategic decision search algorithm are disclosed. By means of obtaining the users' feedback information on an appliance inputted by users or a search result of the appliances being confirmed by the users to generate a mapping between the model of the appliances and at least one load signature of each model of appliances; the users' feedback information is recorded into a smart meter or a cloud computing system, and a mathematical analysis is further used to compute an occurrence of any one signature of the appliance and the identification rate of each signature; then the joint strategic decision search algorithm automatically identifies various models of appliances and analyzes the operating states of the electric appliances in homes or offices.

10 Claims, 3 Drawing Sheets

(56) References Cited

U.S. PATENT DOCUMENTS

| | | | |
|---|---|---|---|
| 2011/0251807 A1* | 10/2011 | Rada et al. | 702/61 |
| 2011/0282504 A1* | 11/2011 | Besore et al. | 700/291 |
| 2012/0290230 A1* | 11/2012 | Berges Gonzalez et al. | 702/61 |
| 2013/0066479 A1* | 3/2013 | Shetty et al. | 700/295 |
| 2013/0096857 A1* | 4/2013 | Chakradhar | 702/61 |
| 2013/0159756 A1* | 6/2013 | Ellis | 713/340 |

* cited by examiner

METHOD AND SYSTEM FOR DETECTING AN APPLICANCE BASED ON USERS' FEEDBACK INFORMATION

The present invention relates to a method and system for detecting an appliance based on users' feedback information, in particular to a nonintrusive method of detecting an electronic load based on the users' feedback information together with a joint decision search algorithm. A smart meter, a home gateway and a database system are further used for implementing the same.

BACKGROUND OF THE INVENTION

At present, most conventional electric meters are widely used to provide an electric consumption bill information to household and corporate users for the use of electricity in last month or within a certain period of time. Although a smart meter can show the power consumption of home or an office instantly in total, yet the smart meter cannot provide the power consumption information of each individual appliance. With a lack of itemized power consumption information of different and individual appliances, users may suffer difficulties to confirm and manage the power consumption situations of the appliances and determine the causes of power consumption from individual appliances. In addition, present existing technologies are suggested to install a power consumption monitoring device at each socket as a smart meter for individual appliances. However, such design leads to a high construction cost and narrows down the willing of users to invest on smart meters to monitor individual appliances.

Therefore, a nonintrusive load monitoring (NILM) technology is invented previously by using a single electric meter to observe a change of the total voltage and current consumed by homes and companies to determine the currently used appliances and their statuses, so that this technology allows the users to know about the operating states of the appliances. In most of the conventional methods, it is assumed that the load signature (also known as signature) of the appliances can be collected and defined in advance, and then the operating states of the appliances can be detected by searching in a power consumption signature database of appliances. Although researches disclosed different detection methods and defined a number of signatures, the collection of the signatures of the appliances and the search of the appliances encounter a certain level of difficulty since there are numerous kinds of appliances in the market, and newly released appliances in the future. Moreover, the power consumption signatures of the same appliances in different houses and locations may be slightly different. The existing NILM solutions based on one average value of the power consumption signatures may not provide accurate search results.

SUMMARY OF THE INVENTION

Therefore, the present invention provides a nonintrusive load monitoring (NILM) method and a system for detecting an appliance based on users' feedback information and a joint decision search algorithm, by means of the nonintrusive load monitoring technology and smart meter, the operating states and the power consumption information of individual appliances at home or in offices can be detected by a single smart meter via the method. Particularly, the users' feedback information is provided for updating a dynamic power consumption or a power load signature (hereafter also known as "power consumption signatures" or "signature") database of electronic appliances. Such database and joint decision search algorithm are used for searching the appliances and evaluating their power consumption to provide itemized power consumption information for homes and companies. The power consumption signature database of appliances is continually updated based on the users' feedback information. The present invention successfully overcomes the problems mentioned above. With the users' feedback information, the system can accommodate and suitable for numerous kinds of appliances in the market, and newly released appliances in the future. Moreover, the power consumption signatures of the same appliances in different houses and locations can be also taken into consideration.

To achieve the aforementioned objective, the present invention provides a method for detecting an appliance based on users' feedback information and the method comprises the following steps of:

obtain the users' feedback information on an appliance, the users' feedback information being inputted by users or a search result of the appliances being confirmed by the users to generate a mapping between the model of the appliances and at least one load signature of each model of appliances, wherein the load signature is produced by a voltage and/or current change when the appliance is turned on/off and/or the operating states of the appliance is being changed.

A mathematical analysis can be used to calculate occurrence or distribution of each signature of a known appliance from the users' feedback information, such that, if a signature of an unknown appliance is detected, the signature can be compared with a data of occurrence or distribution of the signature of known appliance to clarify that the unknown appliance can be classified as a known appliance or not, and the occurrence of any signature of the appliance is defined as a confidence factor. At the same time, Calculate an identification rate of each signature, and the identification rate of each signature is defined as a signature weighted value used for showing the significance of each signature to the correct recognition of the appliance.

By means of the joint strategic decision search algorithm, this invention can automatically determine various models of appliances and analyze the operating states of the appliances.

With the foregoing, the confidence factor of each signature and the identification rate (i.e., weighted value of the load signature) of each load signature are calculated, based on the users' feedback information, and the so-called users' feedback information is generated by inputting correct appliance information or correct appliance operating states, or by confirming a search result of the smart meter operated by a maintenance technician or a household/corporate user when the smart meter is been installed or been used. So that the users' feedback information (also known as "feedback information" hereafter) can help the system to fine tune and calculate the distribution of the confidence factors of each signature of each appliance, so as to calculate the identification rate of each load signature.

The method of detecting the electric application in accordance with the present invention is described in details as follows:

The feedback information includes the information about result of correctness of the automatic determined appliances or indicating that there is no feedback at all. The feedback information can be shown as below:

$$v^k = \begin{cases} v_c, & \text{if the feedback of the electric appliance search result is correct;} \\ v^n, & \text{if the feedback of the electric appliance search result is incorrect; and} \\ v^w, & \text{whether the search result is correct or incorrect is not feedback.} \end{cases}$$

The present invention can further record or store the users' feedback information into a smart meter, a datacenter or a cloud computing system.

The users' feedback information is processed by a discrete function to convert each signature of the appliance into a discrete interval to facilitate a further statistical calculation, and the discrete function is represented by the following equation:

$$\overline{x}_{i,j,k} = \left[\frac{x_{i,j,k}}{U_j}\right] \times U_j$$

Wherein, i is different appliances models and each appliance model has j signatures. Assume that there are k instances of the signatures of the same appliance model. The K instances are from k different houses and buildings that have the same appliance model and contribute the signatures of their appliances to the datacenter of this invention. $x_{i,j,k}$ is the signature of the appliance i for instance k, and $\overline{x}_{i,j,k}$ is a discrete form of $x_{i,j,k}$, $U_j$ is the unit of the discrete form of signature j.

The foregoing equation is provided for converting the $x_{i,j,k}$ values of a continuous real number space into a discrete real number space to facilitate the comparison and examination of the numeric values. For example, there is an appliance A, and there are three users who providing the users' feedback information, wherein the signatures of their home electric appliances A are from 1.12, 1.31 and 1.28 respectively. Assumed that $U_1$=0.1, after a discrete processing, the results are $\overline{x}_{A,1,1}$=1.2, $\overline{x}_{A,1,2}$=1.3, and $\overline{x}_{A,1,3}$=1.3 respectively.

After the discrete signatures is obtained as above, the occurrence of each appliance falling within each numeric interval is accordingly calculated too, and the inventors have defined a counter function $g_{i,j}(x)$ to calculate the occurrence value of the signature when the signature value is x; in other words, this can be described as how many signatures of appliances with the same model are also appeared as x in the past cases contributed by the users. In the aforementioned case, the counter function $g_{i,j}(x)$ of the appliance A is:

$$g_{A,1}(x) = \begin{cases} 1, & \text{if } x = 1.1 \\ 2, & \text{if } x = 1.3 \\ 0, & \text{otherwise} \end{cases}$$

The users' feedback information falling within the same discrete interval is further summed to obtain the distribution of each signature contributed by the users' feedback information, and the summation is given below:

$$g_{i,j}(x) = g_{i,j}(x) + v^k, \text{ if } \overline{x}_{i,j,k} = x$$

Wherein, if the $k^{th}$ feedback information ($\overline{x}_{i,j,k}$) of the signature j of the appliance i falls within the interval in a discrete interval, then $g_{i,j}(x)$ will increase $v^k$.

Based on the occurrence value, the confidence factor can be defined, the confidence factor is a ratio relative to all users' feedback information of the appliances when a signature is calculated and determined to fall within a discrete interval according to the users' feedback information of the appliance, and the confidence factor is a ratio derived from the function $g_{i,j}(x)$. For example, if an unknown appliance has a signature equal to x, and a known appliance has a signature very close to x, then the unknown appliance will likely be the known appliance. The confidence factor of the signature j of the appliance i is defined as a ratio relationship between the occurrence of a signature in an interval x and the largest occurrence in the interval. The confidence factor of the users' feedback of the appliance is represented by the following equation:

$$f_{i,j}(x) = \frac{g_{i,j}(x)}{\text{MAX}(g_{i,j}(x), \forall x)}$$

Wherein, i is the number of different models of appliances, and j is the number of signatures of each appliance i.

In the aforementioned example, the confidence factors of the appliance A are calculated and found to be $f_{A,1}(1.1)$=0.5, $f_{A,1}(1.3)$=1 and $f_{A,1}(x)$=0 if x≠1.1 or 1.3. Based on the confidence factor, a simple method for determine the appliance is to obtain a plurality of signatures of an unknown appliance, by means of comparing signatures with known appliances, the confidence factors can be calculated, and all confidence factors are summed, so that the present can determine an unknown appliance to be a known appliance with a highest summation of the confidence factors. However, if the present invention relies on the confidence factors of each signature of the appliance as the only basis for determining the appliance, then the identification rate may be affected by an insignificant signature with a very high occurrence because the significance of each signature is quite different. If a confidence factor of a signature is popularly existed in known appliances, then the determination result based on the foregoing method will become poor. Therefore, the present invention further defines a weight of a signature as a weighted value to affect or change the significance of the confidence factor of each signature. In the present invention, the confidence factor and the weight of a signature will be changed dynamically with the users' feedback information, wherein the present invention defines the weight of a signature as the summation of the identification rate of the signature for all appliances. The identification rate of a signature for an appliance is defined as follower equation. Firstly, the overlapping of the signature j of each appliance is used for determining the identification rate of the signature. For example, if a signature value is x and there are many appliances also have a higher confidence factor at x. Then, as described above, the signature has many overlapping of the confidence factor of the signature, this will result poor indication rate, so that the present invention redefines the function $h_{i,j}(x)$ to calculate the overlapping of the signature as:

$$h_{i,j}(x) = \begin{cases} \theta\left(\dfrac{f_{i,j}(x)}{\sum_{m \neq i} f_{m,j}(x)}\right), & \text{if } \sum_{m \neq i} f_{m,j}(x) \neq 0 \\ 1, & \text{otherwise} \end{cases}$$

$$\theta(\alpha) = \dfrac{1}{1+e^{-\alpha}}$$

Wherein, i is the number of different models of appliances, and j is the number of signatures of each appliance i.

$\theta(\alpha)$ is a weighted function which can be defined as $$\theta(\alpha) = \dfrac{1}{1+e^{-\alpha}},$$

such that the value calculated by the function $h_{i,j}(x)$ falls between 0.5 and 1. After the overlapping of each signature of each appliance is calculated, a signature of all appliances, or an identification rate of the same model of appliances can be obtained too. That is, the significant of signature of same model of appliances model or all kinds of appliances for distinguishing appliance can be obtained. The weighted value is defined as:

$$w_j = \sum_{i \in Z} h_{i,j}(x) \times \delta.$$

Wherein, $w_j$ is the significant level of a signature j to an appliance i; in other words, the higher the $w_j$ value, the higher the identification rate of the signature j to the appliance i, and vice versa; $\delta$ represents a weighted function for distributing the calculation results to a real number interval to obtain an appropriate comparison space; Z is a set representing all appliances or appliances of the same model.

The function of the weighted value can be adjusted dynamically by the value of overlapping of the signature j of each appliance, and the summation of the overlapping is used for calculating an average overlapping.

Based on the aforementioned considerations, the confidence factor of the signature of each appliance and the identification rate (weighted value) of the signature of the appliance are used for calculating the similarity between an unknown appliance and a known appliance, and the similarity can be calculated by the following equation:

$$\sum_{j=1}^{J} w_j \times f_{i,j}(x)$$

Wherein, i is the number of different models of appliances, and j is the number of signatures of each appliance i.

After the plurality of confidence factors of the appliance signatures and their weighted value are calculated, the joint strategic decision search algorithm can be used to determine the most similar appliance with maximum value. The weighted value is given with a different signature of a different model of appliance according to the analysis and statistical results, and the weighted value of a different signature is used for comparing the similarity of the appliances and searching the appliance. When a set of signatures of an unknown appliance is searched, the weighted values are compared, to calculate the summation of the confidence factors of the known appliance; the larger the value, the higher the possibility of being the known appliance.

In addition, the present invention further provides a system for detecting an appliance based on users' feedback information, comprising: a smart meter, for retrieving and calculating a signature with a slight change produced by AC voltage and current when the appliance is turned on/off or switching status; a home gateway saving each signature of the electric home appliance for further searching, and recording an operating status of the electric home appliance for inquiring a power consumption situation through a mobile phone or a computer; and a datacenter, for saving the electric home appliance information, and transmitting the signature to the datacenter for further searching when the home gateway cannot find the signature of the appliance.

The home gateway provides power saving recommendations and appliance diagnosis through a mobile phone or a computer.

Compared with the prior arts, the present invention bases on a dynamic user's feedback information database and a joint strategic decision search algorithm to perform a nonintrusive load monitoring to detect the status of each appliance and analyze the power consumption, and determine the signature and the weighted value by a more accurate method. With the online user's feedback information mechanism the system can be tuned automatically, also the accuracy of searching the appliances can be improved, and the identification rate of the appliance status by the non-intrusive load monitoring can be enhanced effectively to overcome the problems of the non-intrusive load monitoring, including too many models of appliances to be updated, and a slight difference of the signature of the same appliances used in different places.

For those users who paying no attention to the unnecessary waste of electric power, through this invention, users can know about their power consumption at home or in offices, and 25%-30% of the electric power or the cost of electricity can be saved thereby, and the demand for the electric power can be reduced significantly. In addition, the present invention can calculate the weights of the signatures of different appliances (including the resistive type, the capacitive type, and the inductive type appliances), so that when different types of appliances are searched, different combinations of signatures can be selected according to different identification rates for the joint strategic decision search algorithm.

DESCRIPTION OF THE PREFERRED EMBODIMENTS

The aspect of the present invention will become apparent with the detailed description of the preferred embodiments accompanied with the illustration of related drawings as follows.

Figure 1:
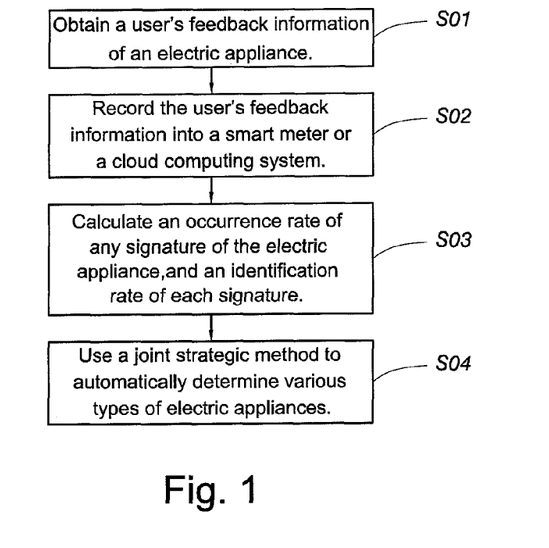
FIG. 1 is a flow chart of a method for detecting an appliance in accordance with the present invention.

With reference to FIG. 1 for a method for detecting an appliance based on users' feedback information in accordance with the present invention, the method comprises the following steps of:

S01: Obtaining a users' feedback information of an appliance, this information can be obtained by electronic load signatures with a slight change produced by AC voltage and current when the appliance is turned on/off or switching status the load signature includes steady-state active power and reactive power, harmonics, transient active power, transient reactive power, and transient state interval . . . etc.

Figure 5:
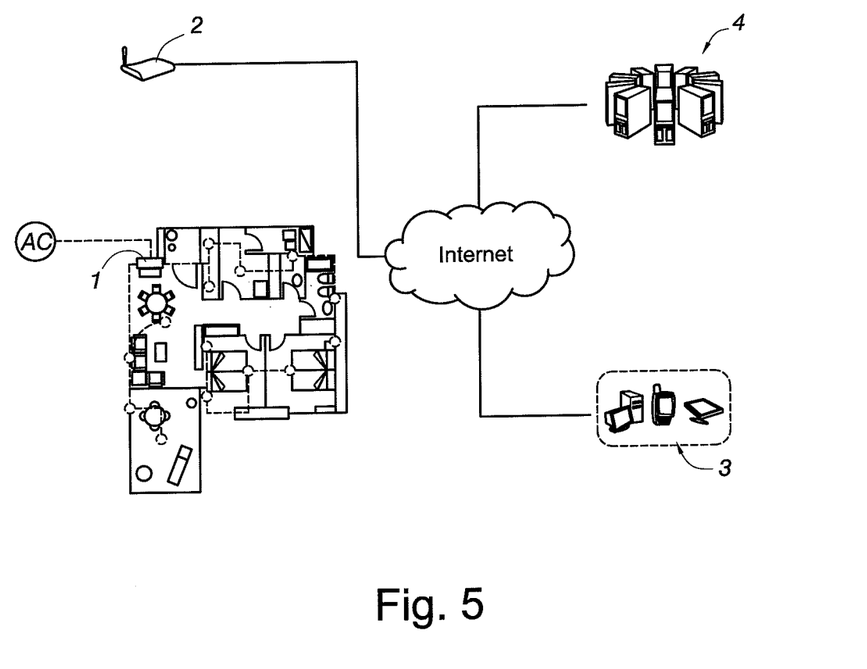
FIG. 5 is a schematic view of architecture of a system for detecting appliances in accordance with the present invention.

The users' feedback information is defined as $v^k$, includes the information indicating about confirming correctness of the automatic determined appliances or showing that there is no confirmation at all; and the feedback information $v^k$ can be defined as follows in actual situations for more detailed express:

(1) manually inputting by the users: For example, a maintenance technician, a household user or a corporate user inputs information of the correct appliance or the correct appliance operating status when a smart meter 1 is been installed and been used (as shown in FIG. 5), and the inputted information is defined as $v^c$ indicating that the model or type of the appliance is correct.

(2) confirming the appliance search result of the smart meter 1, wherein $v^c$ stands for the confirmed search result of the appliance is correct, $v^n$ stands for the confirmed search result of the appliance is incorrect, and $v^W$ stands for the situation that no appliance information is provided or the search result of the appliance is not confirmed.

$$v^k = \begin{cases} v^c, & \text{if the feedback of the electric appliance search result is correct;} \\ v^n, & \text{if the feedback of the electric appliance search result is incorrect; and} \\ v^w, & \text{whether the search result is correct or incorrect is not fed back.} \end{cases}$$

Therefore, the operation situations for the users' to feedback the information can be listed below:

(a) A maintenance technician provides the users' feedback information during an installation or an operation of an appliance.

(b) A household or corporate user provides the users' feedback information during an use, an installation or an operation of an appliance.

(c) A future intelligent home appliance in the future may be able to report the appliance operating status to the smart meter automatically, and the comparison between an appliance operating status and a power load signature of the appliance can be one of the conditions of the users' feedback information.

Therefore, the users' feedback information can provide a function for mapping between a correct appliance status and a power load signature of each appliance status, and the users just need to provide a correct appliance information or confirm the correctness of the search result of the appliance, so that the smart meter 1 can compare the detected signature of each model of appliances with the names of the correct or wrong searched appliances to generate a mapping between the appliance and the power load signature of each model of appliances, so that the users no longer need to know or input the signature of each type of appliances.

S02: Recording the users' feedback information into the smart meter 1 or a cloud computing system. In the meantime, the appliance operating status and the power load signature of each appliance status can be recorded in an appliance signature datacenter 4.

The appliance signature datacenter 4 is a database, and the volume of data in the appliance signature datacenter 4 will increase with the constant use and feedback by the users, and each kind of parameter values is updated to enhance the search accuracy of this invention. The appliance signature datacenter 4 also can be further used for detecting and searching new model appliances which will be marketed and produced in future time.

S03: Calculating each type of the signatures through a mathematical analysis by means of a smart meter 1 or a cloud computing device, so as to calculate occurrence of any signature of the appliance and an identification rate of each signature. By analyzing each type of signatures, which one is suitable to be a parameter for identifying an appliance can be determined, the signature can be a weighted value for identifying an appliance. That is, different signature will have different weighted value after analyzed.

The occurrence of any signature of the appliance is defined as a confidence factor, and the identification rate of each signature is defined as a signature weighted value.

The users' feedback information is used to calculate the confidence factor and the weighted value of each type of signatures, and the feedback information helps the system to tune and calculate the distribution of each appliance with each signature, so as to calculate the confidence factor and the weighted value of each model of signatures.

Each signature of the appliance of each user's feedback information in the appliance signature datacenter 4 is further converting into a discrete value by a discrete function, the discrete function is represented by the following function (1) or can be another known function (not shown in this specification):

$$\bar{x}_{i,j,k} = \left[\frac{x_{i,j,k}}{U_j}\right] \times U_j .. \quad (1)$$

Wherein, assuming that i is the number of different models of appliances in the datacenter, j is the number of signatures of each appliance i, and k is the number of data of the appliance I provided by different users' feedback information.

Therefore, the signature j of the appliance i can be represented by the discrete distribution as shown in Function (1), wherein $x_{i,j,k}$ is the value of the signature j of the $k^{th}$ feedback information of the appliance i, and $\bar{x}_{i,j,k}$ is the result of a numeric value processed by a discrete function. The distribution of the signatures of the appliances has the effects of helping determining whether the users' feedback information is correct or not, telling the users about the ageing situation of the appliance, and automatically determining a new appliance.

The feedback information falling within the same discrete interval are summed to obtain the distribution of the users' feedback information between signatures; and the function (2) represents that the $k^{th}$ feedback information (which is $\bar{x}_{i,j,k}$) of the signature j of the appliance i falls within the interval x in a discrete interval.

$$g_{i,j}(x) = g_{i,j}(x) + v^k, \text{ if } \bar{x}_{i,j,k} = x \quad (2)$$

Wherein, if the $k^{th}$ feedback information ($\bar{x}_{i,j,k}$) of the signature j of the appliance i falls within the interval x in a discrete interval, then $g_{i,j}(x)$ will increase $v^k$.

The function $g_{i,j}(x)$ shows the occurrence times of a signature when the signature is recorded as x. In other words, it can be described as how many signatures of appliances with the same model are also appeared as x in the past cases contributed by the users.

Figure 2:
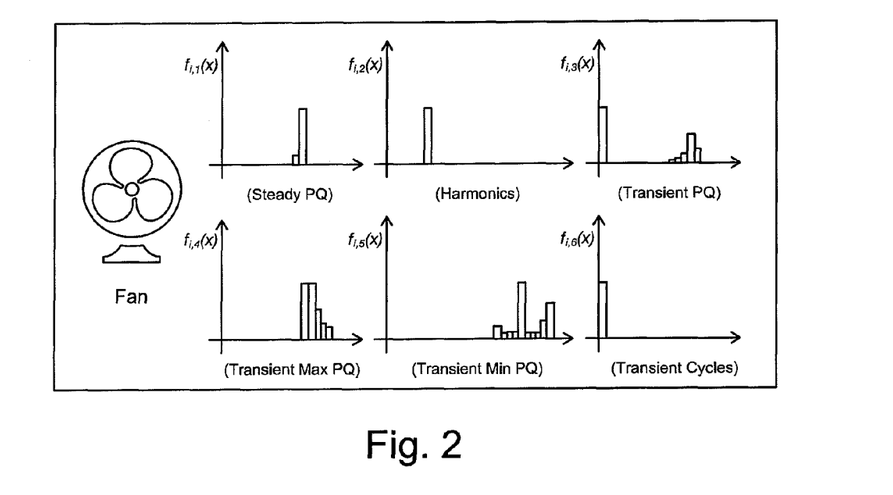
FIG. 2 shows histograms of density distributions of confidence factors of each signature of an electric fan.

With reference to FIG. 2 for the distribution of confidence factors of each signature of the aforementioned electric fan, the x-axis represents the discrete distribution of the signatures, and the y-axis represents the distribution of the users' feedback information. A function can be used to calculate the distribution, which is also called a confidence factor. The confidence factor of the signature j of the appliance i is defined as a ratio relationship between the occurrence of a signature in an interval x and the largest occurrence in the interval. The confidence factor is a ratio corresponding to all users' feedback information of the appliances when a signature is calculated and determined to fall within a discrete interval according to the users' feedback information of the appliance.

The confidence factor is represented by Equation (3), and the confidence factor of the users' feedback of the appliance falls between 0 and 1.

$$f_{i,j}(x) = \frac{g_{i,j}(x)}{\text{MAX}(g_{i,j}(x), \forall x)} \quad (3)$$

Wherein, i is the number of different models of appliances, and j is the number of signatures of each appliance i.

The main purpose of collecting different users' feedback information of the same appliance is to create a confidence factor for each appliance and each load signature of each appliance, and the confidence factor is provided for determining the occurrence of a load signature of an appliance.

In other words, if there is an unknown appliance X, whose load signature is Y, and there is a known appliance Z having a very low occurrence of the same load signature Y, then it is believed that the possibility of such unknown appliance X being the known appliance Z is very low.

After the calculation as described above is achieved, the distribution of the confidence factors of the same signature of the appliances which may have an overlapping portion can also be derived.

Figure 3:
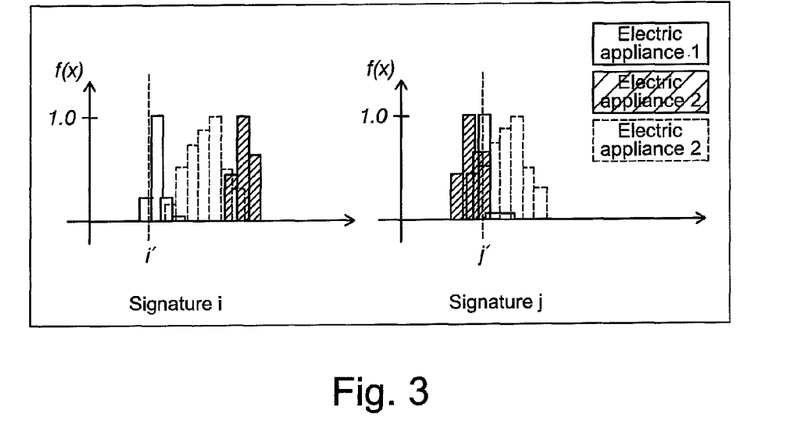
FIG. 3 shows histograms of overlapping confidence factors of signatures among different appliances.

With reference to FIG. 3 for an example describing that the overlapping of the distribution of the confidence factors of each signature of the appliances; wherein an appliance 1, an appliance 2 and an appliance 3 are three different appliances with the same signature i and signature j, and the three models of appliances have overlapping at the signatures i, j, and the signature i has less overlapping (also known as "overlapping rate") in comparison to the signature j. In the distribution of confidence factors as shown in FIG. 3, it can be understood that the signature i can be used for identifying each appliance more easily than the signature j.

Compared with the signature j, the signature i has a higher identification rate for identifying the appliance, so that it is necessary to calculate the identification rate of each signature and use it as the weighted value of the signature.

The weighted value of the load signature will vary dynamically with the users' feedback information, and a different weight value is resulted from a different model of appliance. Equation (4) below or other methods (not shown in this specification) can be used for calculating the weighted value:

$$w_j = \Sigma_{i \in Z} h_{i,j}(x) \times \delta \quad (4)$$

Wherein, $w_j$ is the significant level of a signature j to an appliance i; in other words, the higher the $w_j$ value, the higher the identification rate of the signature j to the appliance i, and vice versa; and δ represents a weighted function for distributing the calculation results to a real number interval to obtain an appropriate comparison space; Z is a set representing all appliances or some appliances of the same model.

The function of the weighted value can be dynamically adjusted by the overlapping rate of the signature j of each appliance, and the summation of the overlapping rate through the function is used for calculating an average overlapping rate, wherein Equation (4) is calculated based on the overlapping rate of the signature j among the appliances, and the overlapping function $h_{i,j}(x)$ is represented by Equation (5) and is mainly used for calculating the relative overlapping rate. In the meantime, the weighted function of θ(α) can be used. For example, $$\theta(\alpha) = \frac{1}{1+e^{-\alpha}},$$

so that the numeric value of $h_{i,j}(x)$ can fall within 0.5 and 1.

$$h_{i,j}(x) = \begin{cases} \theta\left(\frac{f_{i,j}(x)}{\sum_{m \neq i} f_{m,j}(x)}\right), & \text{if } \sum_{m \neq i} f_{m,j}(x) \neq 0 \\ 1, & \text{otherwise} \end{cases} \quad (5)$$

Wherein, i is the number of different models of appliances, j is the number of signatures of each appliance i, and θ(α) is a weighted function.

The significance of each signature and each load signature is calculated to evaluate the similarity between the appliances.

S04: Using a joint strategic decision search algorithm to automatically determine different models of appliances and even their brand and model number to analyze the operating states of the electric home appliances.

Figure 4:
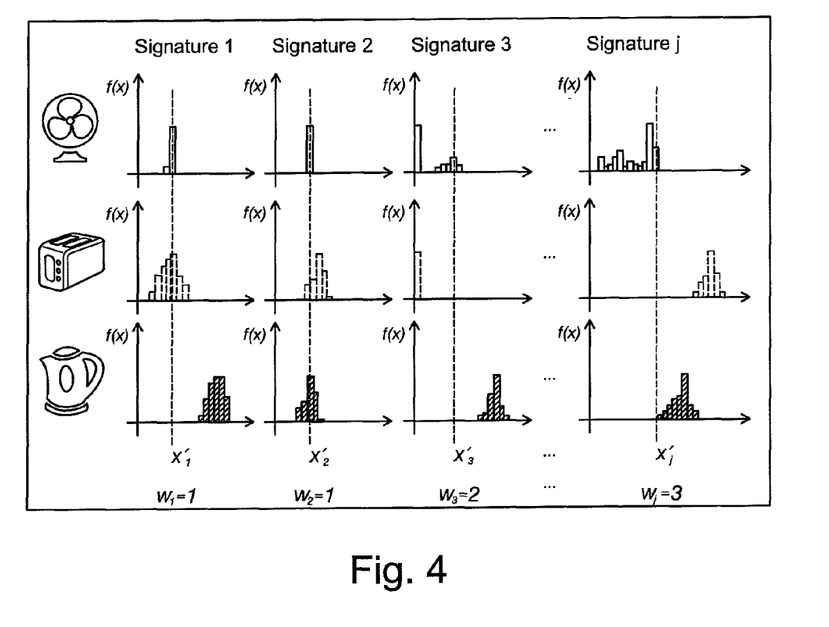
FIG. 4 shows histograms of calculating possible appliances by using a confidence factor of a signature and a weighted value of each signature.

With reference to FIG. 4 for the distribution of various signatures of possible appliances calculated by using the density of confidence factors of the signature, and the method of searching the appliances is achieved by using a plurality of signatures and a joint strategic decision search algorithm.

If there is an unknown appliance with an appliance signature of (x'1, x'2, x'3, . . . , x'j), then this invention can compare the confidence factor of the corresponding signature of the existing known appliance, and the confidence factor can be added to obtain the similarity between the unknown appliance and a known appliance. So that the unknown appliance can be determined as an electric fan because the unknown appliance is most similar to an electric fan after analyze.

However, significance of each signature is quite different, so that, this invention uses the weighted value calculated by the identification rate of the appliance through the signature of each model of the appliance to calculate the similarity between an unknown appliance and a known appliance, and the related equation is given below:

$$\Sigma_{j=i}{}^{j=1} w_j \times f_{i,j}(x) \quad (6)$$

Wherein, i is the number of different models of appliances, j is the number of signatures of each appliance i.

After the plurality of signatures confidence factors of the appliance and weighted value of signatures are calculated, the joint strategic decision search algorithm is further used to determine the most similar appliance who having the maximum value of the equation. The weighted value gives different models of appliances with different signature and gives weighted value to different signature, according to analysis and statistical result, and the weighted value compares the similarity of the appliances and searches the appliance by means of different confident factors.

FIG. 4 illustrates that the weighted value of each signature may be different, and each different models of appliances may have a different signature. For example, appliances can be divided into three major models according to the signatures: a resistive model (or describe as "type"), a capacitive model and an inductive model. When the smart meter 1 receives a request of determining an appliance, the smart meter 1 will analyze the signature of the appliance to determine which model it is, and then the aforementioned method of detecting the appliance by the users' feedback information is used to determine which model this appliance may be.

FIG. 5 is a schematic view of architecture of a system in accordance with the present invention, as shown, the present invention is based on a non-intrusive load monitoring (NILM) to provide a system for detecting appliances, and the detection system comprises a smart meter 1, a home gateway 2 and a datacenter 4, wherein:

The smart meter 1 is used for retrieving and calculating a load signature with a slight change of AC voltage and current when the appliance is turned on/off or switched operating status.

The home gateway 2 is responsible for providing a home network, a digital television signal and a telephone signal, saving each load signature of the electric home appliances to facilitate the search of the appliances, and recording the operating states of the electric home appliance for a user to inquire the power consumption situation through the connection of a mobile phone or computer 3, while providing the functions of power saving recommendations and appliance diagnosis through the mobile phone or computer 3.

The datacenter 4 saves the users' electric home appliance information, and if the home gateway 2 cannot find the signature of the appliance, the signature will be transmitted to the datacenter for further search.

With the foregoing, the method for detecting an appliance based on users' feedback information can be implemented in homes or offices.

Compared with the prior arts, the present invention bases on a dynamic user' feedback database and a joint strategic decision search algorithm to perform a nonintrusive load monitoring to detect the status of each appliance and analyze the power consumption of each appliance. This invention further uses the signature and the weighted value to improve the accuracy of the proposed method. With the automatic online users' feedback information mechanism tuning method and system, the accuracy of searching the appliances can be also improved, and the identification rate of the appliance status by the non-intrusive load monitoring can also be enhanced effectively to overcome the problems of the non-intrusive load monitoring, including too many models of appliances, and the same appliance with a slight difference of the signatures in different places. For the users who are not paying too much attention to the waste of electric power, the present invention can draw the users to know about the power consumption at homes or offices, and approximately 25%~30% of the electric power or the cost of electricity can be saved accordingly. In addition, the present invention calculates the weight of the signatures of different appliances (including the resistive model, capacitive model and inductive model), and a search for different models or types of appliances will select a combination of load signatures according to different identification rates for the joint strategic decision search algorithm.

Although a preferred embodiment is described as above, but the patent scope of this invention should be defined in the following claims.

What is claimed is:

1. A method for detecting an appliance based on users' feedback information, comprising the steps of:
   1. obtaining the users' feedback information on an appliance, the feedback information being inputted by users or a search result of the appliances being confirmed by the users to generate a mapping between the model of the appliances and at least one load signature of each model of appliances, wherein the load signature is produced by a voltage and/or current change when the appliance is turned on/off and/or the operating states of the appliance is being changed;
   2. computing occurrence of any one of signature of the appliance and an identification rate of each signature with the users' feedback information and the occurrence of any one of the signature of the appliance is further defined as a confidence factor, and the identification rate of each signature is further defined as a signature weighted value; and
   3. using a joint strategic decision search algorithm to automatically determine models of appliances, and analyze operating conditions of the appliances.

2. The method for detecting an appliance based on users' feedback information as recited in claim 1, wherein the users' feedback information $v^k$ has three conditions $v^c$, $v^n$ and $v^w$ shown as below:

$$v^k = \begin{cases} v^c, & \text{if the feedback of the electric appliance search result is correct;} \\ v^n, & \text{if the feedback of the electric appliance search result is incorrect; and} \\ v^w, & \text{whether the search result is correct or incorrect is not feedback.} \end{cases}$$

3. The method for detecting an appliance based on users' feedback information as recited in claim 1, further comprising the step of recording the user's feedback information into a smart meter, a datacenter or a cloud computing system.

4. The method for detecting an appliance based on a user's feedback information as recited in claim 1, wherein the user's feedback information converts each signature of the appliance into a discrete value by a discrete function, and the discrete function is represented by the equation of $$\bar{x}_{i,j,k} = \left[\frac{x_{i,j,k}}{U_j}\right] \times U_j,$$

wherein i is the number of different models of appliances, j is the number of signatures of each appliance i, k is the number of data of the appliance i coming from different user's feedback information, $x_{i,j,k}$ is the value of the signature j of the $k^{th}$ feedback information of the appliance i, and $x_{i,j,k}$ is the result of a numeric value processed by a discrete function and Uj is the unit of the discrete form of signature j.

5. The method for detecting an appliance based on users' feedback information as recited in claim 1, wherein the users' feedback information falling within the same discrete interval is summed to obtain distribution of each signature contributed by the users' feedback information, and the summation is given below:

$$g_{i,j}(x)=g_{i,j}(x)+v^k, \text{ if } \overline{x}_{i,j,k}=x$$

wherein $g_{i,j}(x)$ shows the occurrence times of a signature when the signature is recorded as x, if the $k^{th}$ feedback information ($\overline{x}_{i,j,k}$) of the signature j of the appliance i falls within an interval x in the discrete interval, then $g_{i,j}(x)$ increases $v^k$.

6. The method for detecting an appliance based on a user's feedback information as recited in claim 1, wherein the confidence factor can be defined base on the occurrence, the confidence factor is a ratio relative to all users' feedback information of the appliances when a signature is calculated and determined to fall within a discrete interval according to the users' feedback information of the appliance, and the confidence factor is a ratio derived from the function $g_{i,j}(x)$, the confidence factor can be shown below:

$$f_{i,j}(x) = \frac{g_{i,j}(x)}{\text{MAX}(g_{i,j}(x), \forall x)},$$

Wherein, i is the number of different models of appliances, and j is the number of signatures of each appliance i.

7. The method for detecting an appliance based on users' feedback information as recited in claim 1, wherein the load signature (also known as signature) has a weighted value dynamically varied with the user's feedback information, and the appliance of a different model has a different weighted value.

8. The method for detecting an appliance based on users' feedback information as recited in claim 7, wherein the weighted value is expressed by the equation of $$w_j = \sum_{i \in \mathbb{Z}} h_{i,j}(x) \times \delta,$$

wherein, $w_j$ is the significant level of a signature j to an appliance i; the higher the $w_j$ value, the higher the identification rate of the signature j to the appliance i, and vice versa; and $\delta$ represents a weighted function for distributing the calculation results to a real number interval to obtain an appropriate comparison space; Z is a set representing all appliances or some appliances of the same model; the function of the weighted value can be dynamically adjusted by the overlapping rate of the signature j of each appliance, and the summation of the overlapping rate through the function is used for calculating an average overlapping rate and the function can be shown as below:

$$h_{i,j}(x) = \begin{cases} \theta\left(\frac{f_{i,j}(x)}{\sum_{m \neq i} f_{m,j}(x)}\right), & \text{if } \sum_{m \neq i} f_{m,j}(x) \neq 0 \\ 1, & \text{otherwise,} \end{cases}$$

wherein, i is the number of different models of appliances, j is the number of signatures of each appliance i, and $\theta(\alpha)$ is a weighted function.

9. The method for detecting an appliance based on users' feedback information as recited in claim 1, further comprising the step of calculating a similarity between an unknown appliance and a known appliance by the signature of each model of appliances and the identification rate (or weighted value) of each signature of each appliance, the similarity between the unknown appliance and the known appliance is given by the equation of $$\sqrt{\sum_{j=1}^{J} w_j \times f_{i,j}(x)},$$

wherein i is the number of different models of appliances, j is the number of signatures of each appliance i; after the plurality of signatures confidence factors of the appliance and weighted value of signatures are calculated, the joint strategic decision search algorithm is further used to determine the most similar appliance who having the maximum value, the weighted value gives different model of appliance with different signature and gives weighted value to different signature, according to analysis and statistical result, and the weighted value compares the similarity of the appliances and searches the appliance by means of different confident factors.

10. A system for detecting an appliance based on users' feedback information, comprising:
 a smart meter, for retrieving and computing a load signature, wherein the load signature is produced by a voltage and/or current change when the appliance is turned on/off and/or the operating states of the appliance is being changed;
 a home gateway, for saving each load signature of the electric home appliances to facilitate the search of the appliances, and recording the operating states of the electric home appliance for a user to inquire the power consumption situation through the connection of a mobile phone or computer, while providing the functions of power saving recommendations and appliance diagnosis through the mobile phone or computer; and
 a datacenter, for saving the users' electric home appliance information, and if the home gateway cannot find the signature of the appliance, the signature will be transmitted to the datacenter for further searching.

\* \* \* \* \*